(12) United States Patent
Smith et al.

(10) Patent No.: US 11,458,474 B2
(45) Date of Patent: Oct. 4, 2022

(54) MICROFLUIDIC CHIPS WITH ONE OR MORE VIAS

(71) Applicant: International Business Machines Corporation, Armonk, NY (US)

(72) Inventors: Joshua T. Smith, Croton on Hudson, NY (US); William Francis Landers, Wappingers Falls, NY (US); Kevin Winstel, East Greenbush, NY (US); Teresa Jacqueline Wu, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 407 days.

(21) Appl. No.: 15/875,940

(22) Filed: Jan. 19, 2018

(65) Prior Publication Data
US 2019/0224679 A1    Jul. 25, 2019

(51) Int. Cl.
*B81C 1/00* (2006.01)
*B01L 3/00* (2006.01)
(Continued)

(52) U.S. Cl.
CPC ........ *B01L 3/502761* (2013.01); *B01D 15/34* (2013.01); *B01L 3/502707* (2013.01);
(Continued)

(58) Field of Classification Search
None
See application file for complete search history.

(56) References Cited

U.S. PATENT DOCUMENTS

| 8,021,614 B2 | 9/2011 | Huang et al. |
| 8,906,322 B2 | 12/2014 | Huang et al. |

(Continued)

FOREIGN PATENT DOCUMENTS

| CN | 101340836 A | 1/2009 |
| CN | 102052803 A | 5/2011 |

(Continued)

OTHER PUBLICATIONS

International Search Report and Written Opinion for PCT/IB2019/050271 dated Feb. 28, 2019, 9 pages.

(Continued)

*Primary Examiner* — Paul S Hyun
(74) *Attorney, Agent, or Firm* — Amin, Turocy & Watson, LLP (57) ABSTRACT

Microfluidic chips that can comprise thin substrates and/or a high density of vias are described herein. An apparatus comprises: a silicon device layer comprising a plurality of vias, the plurality of vias comprising greater than or equal to about 100 vias per square centimeter of a surface of the silicon device layer and less than or equal to about 100,000 vias per square centimeter of the surface of the silicon device layer, and the plurality of vias extending through the silicon device layer; and a sealing layer bonded to the silicon device layer, wherein the sealing layer has greater rigidity than the silicon device layer. In some embodiments, the silicon device layer has a thickness between about 7 micrometers and about 500 micrometers while a via of the plurality of vias has a diameter between about 5 micrometers and about 5 millimeters.

6 Claims, 10 Drawing Sheets

(51) Int. Cl.
*B81B 1/00* (2006.01)
*B01D 15/34* (2006.01)
*G01N 27/447* (2006.01)
*G01N 30/60* (2006.01)

(52) U.S. Cl.
CPC ... *B01L 3/502715* (2013.01); *B01L 3/502753* (2013.01); *B81B 1/00* (2013.01); *G01N 27/44704* (2013.01); *G01N 27/44773* (2013.01); *B01L 2200/027* (2013.01); *B01L 2200/0689* (2013.01); *B01L 2200/12* (2013.01); *B01L 2300/0816* (2013.01); *B01L 2300/0887* (2013.01); *B01L 2300/12* (2013.01); *B81C 1/00119* (2013.01); *G01N 27/44791* (2013.01); *G01N 30/6095* (2013.01)

(56) References Cited

U.S. PATENT DOCUMENTS

| | | |
|---|---|---|
| 9,636,675 B2 | 5/2017 | Astier et al. |
| 9,700,891 B2 | 7/2017 | Smith et al. |
| 9,835,538 B2 | 12/2017 | Astier et al. |
| 10,324,011 B2 | 6/2019 | D'Silva et al. |
| 2006/0144076 A1 | 7/2006 | Daddis et al. |
| 2007/0020496 A1* | 1/2007 | Pelton .......... H01M 4/8605 429/454 |
| 2009/0212407 A1* | 8/2009 | Foster .......... B81B 7/007 257/686 |
| 2010/0059414 A1 | 3/2010 | Sturm et al. |
| 2010/0200992 A1 | 8/2010 | Purushothaman et al. |
| 2012/0037544 A1 | 2/2012 | Lane et al. |
| 2013/0168298 A1 | 7/2013 | Huang et al. |
| 2014/0154703 A1 | 6/2014 | Skelley et al. |
| 2015/0054149 A1 | 2/2015 | Purushothaman et al. |
| 2015/0064153 A1 | 3/2015 | Civin et al. |
| 2015/0190804 A1 | 7/2015 | Pesaturo et al. |
| 2016/0047735 A1 | 2/2016 | Grisham et al. |
| 2016/0061811 A1 | 3/2016 | Kelley et al. |
| 2016/0121331 A1 | 5/2016 | Kapur et al. |
| 2016/0139012 A1 | 5/2016 | D'Silva et al. |
| 2016/0144361 A1 | 5/2016 | Astier et al. |
| 2016/0144405 A1 | 5/2016 | Astier et al. |
| 2016/0144406 A1 | 5/2016 | Astier et al. |
| 2016/0146717 A1 | 5/2016 | Astier et al. |
| 2016/0146718 A1 | 5/2016 | Astier et al. |
| 2016/0244714 A1 | 8/2016 | Spuhler et al. |
| 2017/0248508 A1 | 8/2017 | Ward et al. |
| 2017/0312747 A1 | 11/2017 | Hu et al. |
| 2018/0078939 A1 | 3/2018 | Hu et al. |
| 2018/0080060 A1 | 3/2018 | Gifford et al. |
| 2018/0080857 A1 | 3/2018 | Gifford et al. |
| 2019/0126278 A1 | 5/2019 | Arai |
| 2019/0224677 A1 | 7/2019 | Smith et al. |
| 2019/0226953 A1 | 7/2019 | Wunsch et al. |
| 2020/0038861 A1 | 2/2020 | Yoon et al. |
| 2020/0122144 A1 | 4/2020 | Smith et al. |
| 2020/0139370 A1 | 5/2020 | Kapur et al. |

FOREIGN PATENT DOCUMENTS

| | | |
|---|---|---|
| CN | 105161473 A | 12/2015 |
| CN | 105293428 A | 2/2016 |
| CN | 105745021 A | 7/2016 |
| EP | 2119503 A2 | 11/2009 |
| JP | H0926283 A | 1/1997 |
| JP | 2008-538282 A | 10/2008 |
| JP | 2008-538283 A | 10/2008 |
| JP | 2017-536824 A | 12/2017 |
| WO | 2017087940 A1 | 5/2017 |
| WO | 2017/221898 A1 | 12/2017 |

OTHER PUBLICATIONS

International Search Report and Written Opinion for PCT/IB2019/050272 dated Mar. 27, 2019, 10 pages.
International Search Report and Written Opinion for PCT/IB2019/050273 dated Apr. 8, 2019, 9 pages.
Smith, et al. "Microfluidic Devices With Multiple Inlets and Outlets." U.S. Appl. No. 16/168,330, filed Oct. 23, 2018. 39 pages.
Smith, et al. "Microfluidic Chips With One or More Vias Filled With Sacrificial Plugs." U.S. Appl. No. 16/168,292, filed Oct. 23, 2018. 37 pages.
Zhao, et al., Microfluidic Techniques for Analytes Concentration, Micromachines, Jan. 22, 2017, 32 Pages, vol. 8, No. 28.
Salafi, et al., Advancements in microfluidics for nanoparticle separation, Lab on a Chip, Oct. 26, 2016, pp. 11-33, vol. 17, No. 11.
Wunsch, et al., Nanoscale lateral displacement arrays for the separation of exosomes and colloids down to 20 nm, Nature Nanotechnology, Aug. 1, 2016, pp. 936-940, vol. 11.
Contreras-Naranjo, et al., Microfluidics for exosome isolation and analysis: enabling liquid biopsy for personalized medicine, Lab on a Chip, Aug. 7, 2017, pp. 3558-3577, vol. 17, No. 21.
Woo, et al., Exodisc for rapid, size-selective, and efficient isolation and analysis of nanoscale extracellular vesicles from biological samples, ACS Nano, Jan. 9, 2017, pp. 1360-1370, vol. 11, No. 2.
Liu, et al., Field-free isolation of exosomes from extracellular vesicles by microfluidic viscoelastic flows, ACS Nano, Jul. 5, 2017, pp. 6968-6976, vol. 11, No. 7.
Liu, et al., The exosome total isolation chip, ACS Nano, Nov. 1, 2107, pp. 10712-10723, vol. 11.
Kim, et al., Broken flow symmetry explains the dynamics of small particles in deterministic lateral displacement arrays, PNAS, Jun. 12, 2017, pp. E5034-E5041, vol. 114, No. 26.
Loutherback, et al., Improved performance of deterministic lateral displacement arrays with triangular posts, Microfluid Nanofluid, May 12, 2010, pp. 1143-1149, vol. 9.
Laki, et al., Microvesicle fractionation using deterministic lateral displacement effect, Proceedings of the 9th IEEE International Conference on Nano/Micro Engineered and Molecular Systems (NEMS), Apr. 13, 2014, pp. 490-493.
Laki, et al., Separation of Microvesicles from Serological Samples Using Deterministic Lateral Displacement Effect, BioNanoScience, 2015, pp. 48-54, vol. 5, No. 1.
Tran, et al., Open channel deterministic lateral displacement for particle and cell sorting, Lab on a Chip , Sep. 18, 2107, pp. 3592-3600, vol. 17, No. 21.
Yuan, et al., On-Chip Microparticle and Cell Washing Using Coflow of Viscoelastic Fluid and Newtonian Fluid, Analytical Chemistry, Aug. 8, 2107, 10 Pages.
Wang, et al., Ciliated micropillars for the microfluidic-based isolation of nanoscale lipid vesicles, Lab on a Chip, May 7, 2103, pp. 2879-2882, vol. 13.
Sehgal, et al., Separation of 300-nm and 100-nm particles in Fabry-Perot acoustofluidic resonators, Analytical Chemistry, Oct. 17, 2017, pp. 12192-12200, vol. 89.
Kanwar, et al., Microfluidic device (ExoChip) for on-chip isolation, quantification and characterization of circulating exosomes, Lab on a Chip 14, Mar. 14, 2014, pp. 1891-1900, vol. 14.
Ibsen, et al., Rapid isolation and detection of exosomes and associated biomarkers from plasma, ACS Nano, Jul. 3, 2107, pp. 6641-6651, vol. 11.
Nge, et al., Advances in microfluidic materials, functions, integration, and applications, Chemical Reviews, Feb. 14, 2013, pp. 2550-2583, vol. 113.
McDonald, et al., Fabrication of microfluidic systems in poly(dimethylsiloxane), Electrophoresis, 2000, pp. 27-40, vol. 21.
Wu, et al., Isolation of exosomesfrom whole blood by integrating acoustics and microfluidics, PNAS, Oct. 3, 2017, pp. 10584-10589, vol. 114, No. 40.
Dang, et al., Integrated Microfluidic Cooling and Interconnects for 2D and 3D Chip, IEEE Transcations on Advanced Packaging, Feb. 2010, vol. 33. No 1.
Non-Final Office Action received for U.S. Appl. No. 15/875,940 dated May 15, 2020, 42 pages.
Non-Final Office Action received for U.S. Appl. No. 15/875,862 dated Sep. 18, 2020, 48 pages.
List of IBM Patents or Applications treated as related.

(56) References Cited

OTHER PUBLICATIONS

Non-Final Office Action received for U.S. Appl. No. 15/875,862 dated Dec. 31, 2021, 40 pages.
Office Action received for G.B. Patent Application Serial No. 2010161.4 dated Nov. 4, 2021, 5 pages.
Office Action received for G.B. Patent Application Serial No. 2010161.4 dated Jan. 19, 2022, 3 pages.
Office Action received for G.B. Patent Application Serial No. 2010486.5 dated Jan. 24, 2022, 4 pages.
Office Action received for G.B. Patent Application Serial No. 2011413.8 dated Feb. 22, 2022, 4 pages.
Notice of Reasons for Refusal received for Japanese Patent Application Serial No. 2020-538794 dated Apr. 26, 2022, 10 pages.
Notice of Reasons for Refusal received for Japanese Patent Application Serial No. 2020-538856 dated May 10, 2022, 6 pages.
List of IBM Patents or Applications treated as related, 2020.

\* cited by examiner

MICROFLUIDIC CHIPS WITH ONE OR MORE VIAS

BACKGROUND

The subject disclosure relates to microfluidic chips, and more specifically, to microfluidic chips that can comprise thin substrates and/or a high density of vias.

Extensive and growing interest in lab-on-a-chip ("LOC") technologies is evident from the tens of thousands of currently available in literature from close-system microfluidic publications alone. Such a broad interest in microfluidic technologies is representative of their many advantages over traditional laboratory methods, such as the ability to carry out separation and detection with high resolution and sensitivity, need for only very small quantities of sample and reagent, small footprint of the analytical devices these chips contain, low cost of manufacture, and short time of analysis.

With such great potential benefits, a number of material options and techniques have been explored to integrate microfluidic features and devices to separate, detect, and manipulate biological analytes. For microfluidic applications requiring high-density parallelization, biological samples and other fluids introduced into a silicon chip must have exit points, or fluidic outlets, at a high packing density to collect material. When fluidic vias are integrated at low density, structured glass (glass with holes) can be bonded to silicon as a last process step or defined in thermoplastics; however, at high density, wherein hundreds or thousands of vias are required at small sizes (e.g., 50 micrometers (μm) diameters or less), these standard options are no longer possible, either physically (e.g., in silicon due difficulties of etching through the thickness of a standard 200 millimeter (mm) or 300 mm wafer) or practically from a cost perspective (e.g., due to structured glass manufacturing limitations). Therefore, a method of manufacturer is required that can accomplish this feat to enable applications that require a high density of vias (e.g., nanoscale deterministic lateral displacement ("nanoDLD") arrays) for separating particles (e.g., exosomes).

A key challenge for LOC manufacturing in silicon, when high-density vias are implemented into a design, is to make the vias fluidically accessible and eliminate downstream wets processing common in semiconductor manufacturing, such as wet cleans. Wet processes can wick these fluids into the microfluidic device through capillary action, rendering the device unusable.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses, methods, and/or systems regarding microfluidic chips with high via density are described.

According to an embodiment, an apparatus is provided. The apparatus can comprise a silicon device layer, which can comprise a plurality of vias. The plurality of vias can comprise greater than or equal to about 100 vias per square centimeter of a surface of the silicon device layer and less than or equal to about 100,000 vias per square centimeter of the surface of the silicon device layer. Also, the plurality of vias can extend through the silicon device layer. The apparatus can also comprise a sealing layer bonded to the silicon device layer, which can have greater rigidity than the silicon device layer.

According to an optional embodiment, the apparatus can further comprise a microfluidic element that can be located on a second surface of the silicon device layer. The microfluidic element can be in fluid communication with a via of the plurality of vias. Also, the microfluidic element can be encapsulated by a combination of the silicon device layer and the sealing layer.

According to another embodiment, a method is provided. The method can comprise defining a microfluidic element on a first surface of a device layer. The method can also comprise bonding a sealing layer to the first surface of the device layer. A combination of the sealing layer and the device layer can encapsulate the microfluidic element. The method can further comprise forming, after the bonding, a via within the device layer. The via can extend from a second surface of the device layer to a first surface of the device layer. Also, the second surface can be located on an opposite side of the device layer than the first surface. In one or more embodiments, the method can further comprise thinning the device layer after the bonding and before the forming of the via.

According to another embodiment, an apparatus is provided. The apparatus can comprise a silicon device layer comprising a via and a microfluidic device. The via can extend through the silicon device layer and can be in fluid communication with the microfluidic device. Also, the silicon device layer can have a thickness greater than or equal to about 7 micrometers and less than or equal to about 500 micrometers. The apparatus can also comprise a sealing layer bonded to the silicon device layer. The sealing layer can have greater rigidity than the silicon device layer.

According to an optional embodiment, the via can be comprised within a plurality of vias. The plurality of vias can comprise greater than or equal to about 100 vias and less than or equal to about 100,000 vias per square centimeter of a surface of the silicon device layer opposite to the sealing layer.

Thus, various embodiments described herein can provide a manufacturable structure and approach to create LOC technologies with high-density microfluidic vias. It is useful, for example, for LOC technologies that require high-throughput sample preparation. Also, one or more methods described herein can provide a means of protecting sealed microfluidic features from downstream wets processing (e.g., by opening vias last to make microfluidic features accessible using a final dry process).

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
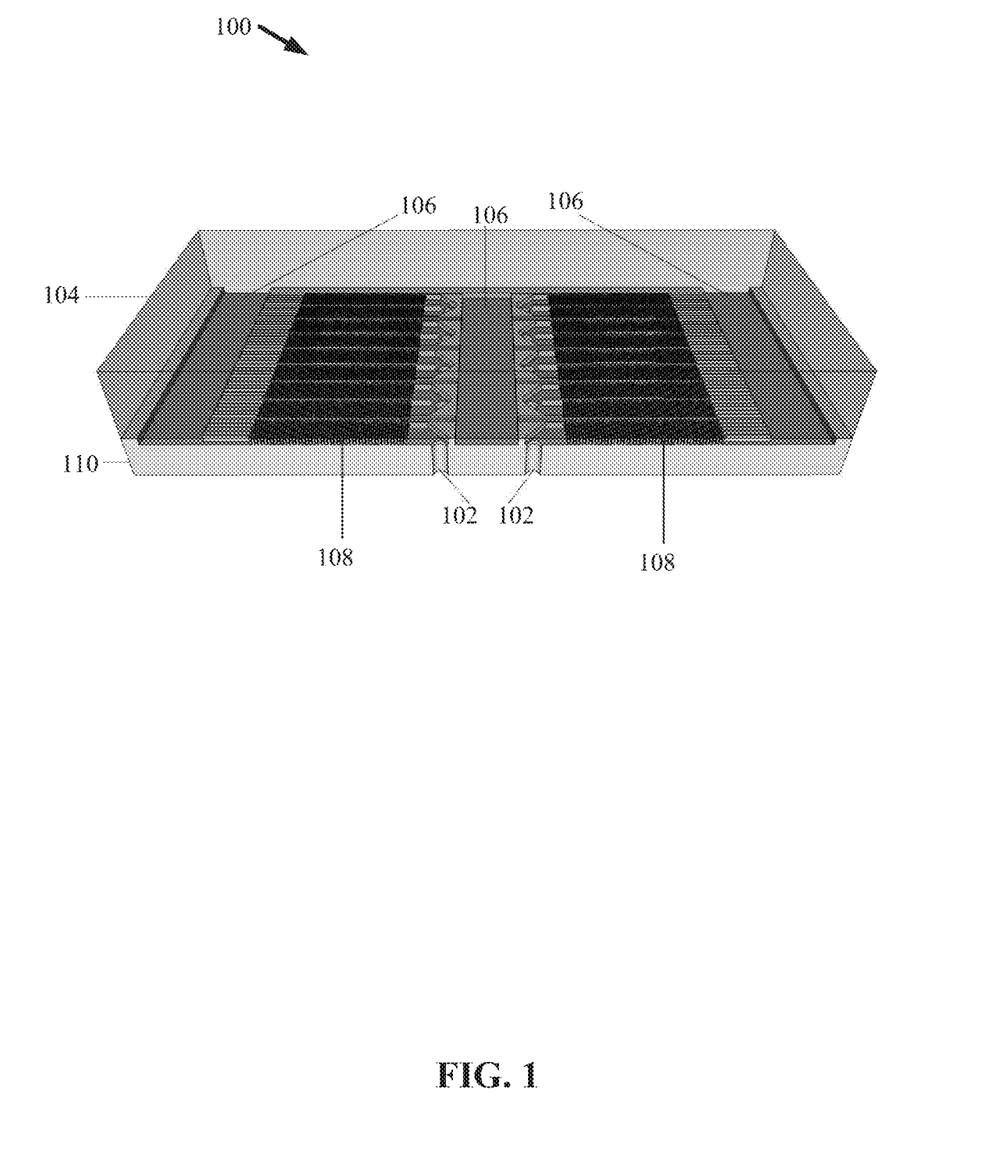
FIG. 1 illustrates a diagram of an example, non-limiting microfluidic chip that can comprise a high density of vias in accordance with one or more embodiments described herein.

FIG. 1 illustrates a diagram of an example, non-limiting microfluidic chip 100 in accordance with one or more embodiments described herein. The microfluidic chip 100 can comprise one or more vias 102, a sealing layer 104, one or more buses 106, one or more microfluidic elements 108, and/or a device layer 110. In one or more embodiments, the microfluidic chip 100 can comprise a high density of vias 102 within the device layer 110. In some embodiments, the microfluidic chip 100 can comprise a thin device layer 110 and/or one or more vias 102 in fluid communication with the one or more microfluidic elements 108, which can be characterized by one or more dimensions that are greater than or equal to 1 nanometer and less than or equal to 10 millimeters. The sealing layer 104 and/or the device layer 110 can respectively comprise silicon (e.g., silicon compositions), glass, a combination thereof, and/or the like.

Silicon is a well-established material in fabrication methods that can utilize subtractive (e.g. wet or dry etching) or additive methods (e.g. metal or chemical vapor deposition) to create microfluidic structures with nanoscale placement and features. High elastic modulus (e.g., characterized by 130-180 gigapascals (GPa)) can form rigid well-defined structures. Silanol group (—Si—OH) surface chemistry is well developed (e.g., surface modification with silanes). Further, silicon's ability to scale and integrate to provide complex functionality can be very high. However, silicon is not transparent to visible light, so typical fluorescence detection or fluid imaging is challenging; although this can be overcome by bonding a transparent material to the surface of silicon, such as a polymer or glass. Also, silicon's high elastic modulus can make silicon difficult to be made into active fluidic components such as valves and pumps.

Glass fabrication methods exist that can utilize subtractive or additive methods to create microfluidic structures albeit not at the precision and scale of silicon. Glass can have low background fluorescence, and like silicon, can have silanol-based surface modification chemistries readily available. Also, glass can be compatible with biological samples, can have relatively low nonspecific adsorption, and can be gas impermeable. However, compared to silicon, glass fabrication methods are not nearly as broad or precise (e.g., nanoscale features for microfluidics that are possible in silicon can be difficult to implement in glass). Glass can also have a large, composition-dependent elastic modulus (e.g., hybrid devices can be required for active components such as valves and pumps).

Other materials that conventionally comprise microfluidic chip technologies can include ceramics, elastomers, thermoplastics, and/or paper. However, one or more embodiments of the microfluidic chips 100 described herein can comprise silicon and/or glass materials due at least in part to one or more structural and/or manufacturing difficulties ceramics, elastomers, thermoplastics, and/or paper can exhibit in microfluidic platforms. For example, low-temperature cofired ceramics ("LTCC") can be fabricated into complex three-dimensional devices, wherein each layer can be inspected for quality control before assembling. Electrodes can be deposited using expansion matched metal pastes (e.g., for added functionality for detection and separation). Also, organically modified ceramics can provide an optically transparent, UV-curable material. However, high-density ceramic electronics and multiplexed or integrated ceramic architectures can be difficult to implement. Further, features such as electrodes and channels can typically be 10's to 100's of microns in size and. not adaptable to certain types of microfluidic elements such as smaller pillar arrays or nanochannels. Also, ceramics can have a high elastic modulus, thereby rendering ceramics difficult to be made into active fluidic components such as valves and pumps. Moreover, ceramics can be difficult to hybridize with other materials.

Regarding elastomers, polydimethylsiloxane ("PDMS") can be low in cost and is perhaps the most common microfluidic substrate. Elastomers can be easy to fabricate using a number of processes, including conventional machining and photolithography, and elastomers can be cast, stamped, and cured on molds. Elastomers can have low elastic modulus (e.g., 300-500 kilopascals (kPa)), thereby making them useful for making values and pumps. PDMS can be gas permeable and thereby useful for oxygen and/or carbon dioxide transport in cellular studies. Also, elastomers can be transparent in the visible range, so typical fluorescence detection or fluid imaging can be employed. However, since PDMS can be gas permeable, it can cause problematic bubble formation. Also, PDMS can be a hydrophobic material and thereby susceptible to nonspecific adsorption and permeation by hydrophobic molecules. Other example elastomers can include, but are not limited to: thermoset polyester ("TPE"), polyfluoropolyether diol methacrylate ("PFPE-DMA"), and/or polystyrene ("PS").

Further, thermoplastics can be highly moldable and manufacturable given they are durable, amenable to micromachining, hot embossing, and injection molding processes. Thermoplastics can be optically clear, resistant to permeation of small molecules, and stiffer than elastomers. Also, thermoplastics can be thermally, and/or laser, bonded to seal two layers together. For example, cyclic-olefin copolymer ("COC") can be suitable for use with most solvents and aqueous solutions and can have low background fluorescence. Further, thermoplastics can have low manufacturing costs. However, COC can be hydrophobic, and thereby require surface modification to reduce nonspecific adsorption. Also, thermoplastics can typically require another medium (e.g., a master mold) to replicate many devices (e.g. silicon master).

Moreover, paper can be extremely cheap and readily available, can be disposed of by burning or natural degradation, and can be easily patterned and functionalized. Porous paper can allow for a combination of flow, filtering, and separation. Also, paper can be biologically compatible and chemically modified through composition or formulation changes or by implementing surface chemistry. However, paper can rely on passive capillary action for operation, and thereby paper system may not be amenable to more complex functionality or material hybridization.

Considerations regarding the selection of materials comprising the sealing layer 104 and/or the device layer 110 can include, but are not limited to: the required function of the layers, the degree of microfluidic element 108 integration needed on the layers, and/or the final application of the microfluidic chip 100. In one or more embodiments, the choice of silicon and/or silicon-glass systems are most attractive in LOC applications requiring high-density device integration, parallelization, multi-functional or multi-device arrangements (separation and detection, for example) or in application requiring embedded microelectronics. For example, the sealing layer 104 can comprise glass and the device layer 110 can comprise silicon (e.g., a crystalline silicon such as a silicon wafer). In an embodiment in which the device layer 110 comprises silicon, high pressures can be applied to the microfluidic element 108 as a driving force to operate the microfluidic chip 100 without deforming the structures.

The sealing layer 104 can be bonded to the device layer 110. The sealing layer 104 can have greater rigidity that the device layer 110, thereby providing enhanced rigidity to the device layer 110 during manufacturing of the microfluidic chip 100. Further, the sealing layer 104 can encapsulate the one or more microfluidic elements 108 and/or the one or more buses 106; thereby protected the one or more microfluidic elements 108 and/or the one or more buses 106 during manufacturing of the microfluidic chip 100. The sealing layer 104 can have a thickness greater than or equal to 100 μm and less than or equal to 2.5 mm. The device layer 110 can have a thickness greater than or equal to 7 μm and less than or equal to 500 μm. In one or more embodiments, the sealing layer 104 can be thicker than the device layer 110.

The one or more buses 106 (e.g., fluid buses) can be embedded, subtractively patterned, and/or otherwise etched into the device layer 110. The one or more buses 106 can serve as channels that guide and/or transport fluid through the microfluidic chip 100 with low fluidic resistance. For example, the one or more buses 106 can form a bus network that can carry fluid to and/or from the one or more microfluidic elements 108. The microfluidic elements 108 can be embedded within the device layer 110 and/or be located on a top surface of the device layer 110, which is bonded to the sealing layer 104. The microfluidic elements 108 can comprise one or more devices that can utilize deterministic displacement arrays and/or deterministic lateral displacement technologies ("DLD"), such as condenser arrays (e.g., microscale condenser arrays and/or nanoscale condenser arrays) and/or nanoDLD arrays. Further example microfluidic elements 108 can include, but are not limited to: microscale and/or nanoscale pillars, channels, biosensors, fluid mixing features, fluidic bus networks, fluidic inlets, and/or fluidic outlets.

One or more of the buses 106 and/or the microfluidic elements 108 can be in fluid communication with the one or more vias 102. The one or more vias 102 can traverse through the device layer 110. For example, the one or more vias 102 can extend from a first side of the device layer 110 to a second side of the device layer 110 (e.g., wherein the sealing layer 104 can be boned to the second side of the device layer 110).

In one or more embodiments, the microfluidic chip 100 can have a high density of vias 102 traversing the device layer 110. For example, the microfluidic chip 100 can comprise hundreds to tens of thousands of vias 102 per square centimeter of the device layer 110. For instance, the microfluidic chip 100 can comprise greater than or equal to 100 vias 102 per square centimeter of the device layer 110 and less than or equal to 100,000 vias 102 per square centimeter of the device layer 110. Additionally, the one or more vias 102 can have diameters greater than or equal to 5 μm and less than or equal to 5 mm. Moreover, respective vias 102 of the one or more vias 102 can share a common diameter or can have different diameters. One of ordinary skill in the art will recognize that although FIG. 1 shows a particular number of vias 102, buses 106, and/or microfluidic elements 108, the architecture of the microfluidic chip 100 is not so limited. For example, the microfluidic chip 100 can comprise fewer or additional vias 102, buses 106, and/or microfluidic elements 108 than those depicted in FIG. 1.

Figure 2:
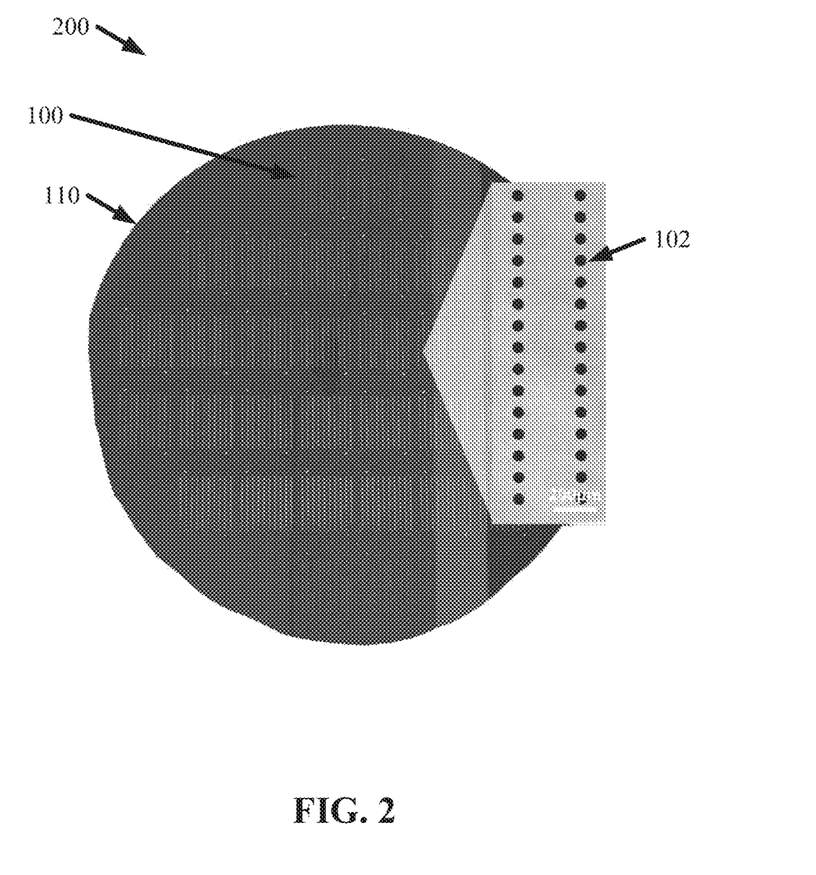
FIG. 2 illustrates a photo of an example, non-limiting wafer containing microfluidic chips that can comprise a high density of vias in accordance with one or more embodiments described herein.

FIG. 2 illustrates a photo of an example, non-limiting wafer 200 that can comprise one or more microfluidic chips 100 (e.g., including a device layer 110 (e.g., comprising silicon) and/or sealing layer 104 (e.g., comprising glass)) in accordance with one or more embodiments described herein. Repetitive description of like elements employed in other embodiments described herein is omitted for sake of brevity. The wafer 200 can have a thickness greater than or equal to 300 μm and less than or equal to 2.5 mm. Also, the wafer 200 can comprise greater than or equal to 1 microfluidic chips 100 and less than or equal to 32,000 microfluidic chips 100. For example, the wafer 200 can have a thickness of 200 mm and comprise 32 microfluidic chips 100. Further, wafer 200 of FIG. 2 can comprise one or more microfluidic chips 100 that can have one or more vias 102 having a common diameter of 50 μm and/or a density of 1,000 vias 102 per square centimeter. Additionally, the wafer 200 can comprise one or more chip boarders (not shown) etched into the wafer 200 to facilitate separation of one or more of the microfluidic chips 100 (e.g., via chip dicing). The one or more chip boarders can help prevent damage to the thin device layer 110 at the edges of the subject microfluidic chip 100 being separated.

Figure 3:
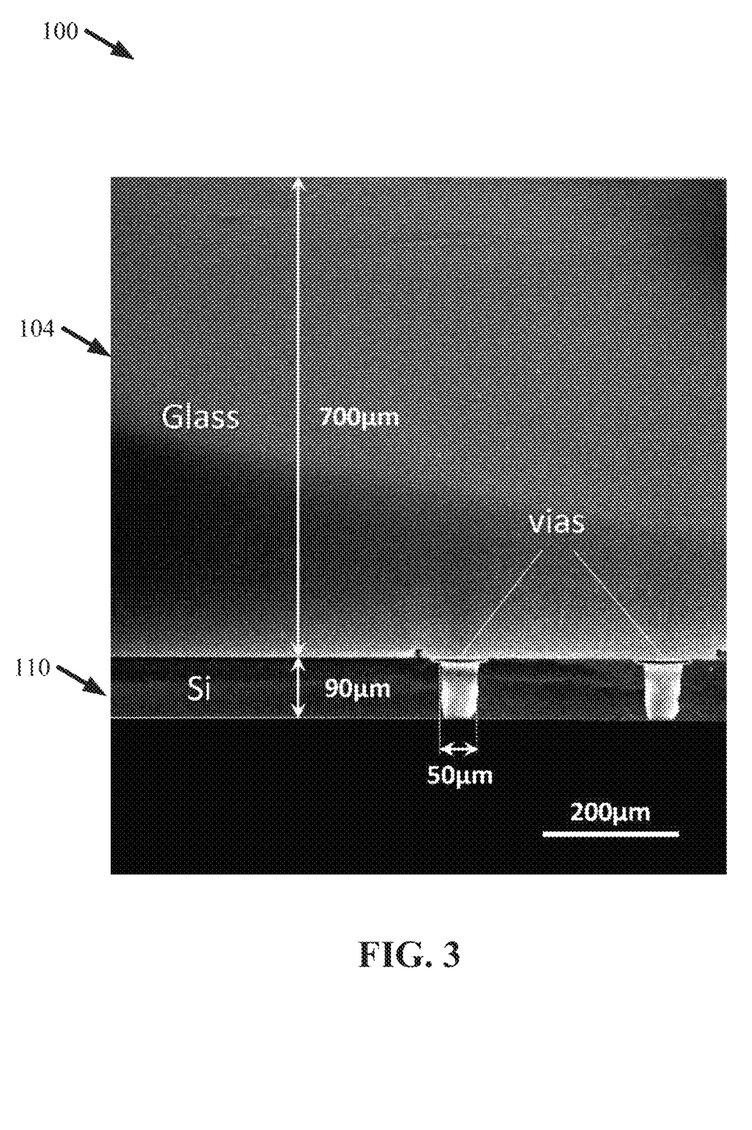
FIG. 3 illustrates another photo of an example, non-limiting microfluidic chip that can comprise a high density of vias in accordance with one or more embodiments described herein.

FIG. 3 illustrates a scanning electron micrograph ("SEM") of an exemplary microfluidic chip 100 of the wafer 200 shown in FIG. 2. Repetitive description of like elements employed in other embodiments described herein is omitted for sake of brevity. FIG. 3 depicts a cross-section of the microfluidic chip 100. As shown in FIG. 3, the exemplary microfluidic chip 100 can comprise a glass sealing layer 104 having a thickness of 700 μm, and a silicon device layer 110 of 90 μm.

Conventional methods of manufacturing are unable to produce the microfluidic chip 100 due at least to the following considerations. First, the one or more vias 102 described herein can require much thinner substrates (e.g., device layer 110) to etch completely through the wafers (e.g., wafer 200) to create fluidically accessible holes. The one or more vias 102 can have aspect ratios greater than 1:10 (diameter:depth), which can be challenging to create using the conventional standard for via creation of reactive-ion etch ("RIE"). Second, etching completely through a wafer (e.g., wafer 200) can also be problematic as many of these RIE chambers have inductively coupled wafer chucks and use vacuum systems that will be damaged or error out during processing if the device layer 110 is etched through completely. Third, the thin device layer 110 can imply the need for a carrier wafer of some kind to support the thin device layer 110, which can be extremely brittle when thinned to, for example, 50 μm thickness (e.g., which can facilitate 5 μm diameter vias 102). Thin wafers (e.g., thin device layers 110) can also be desired to reduce RIE process time to create the vias 102. Fourth, thin device layers 110 cannot be de-bonded from the carrier after polishing as the silicon is too brittle and a microfluidic sealing layer 104 can still be required. This presents a fifth challenge of preventing fluidic wicking or capillary wetting of microfluidic features due to post via 102 wet processing common in semiconductor manufacturing. Standard thru-silicon via ("TSV") technology can use a fill material, such as copper, to plug the vias 102, which does not translate to microfluidic devices. Collectively, these challenges call for a via-last structure and method that can protect sealed microfluidic features from downstream wets processing (e.g. chemical mechanical polishing (CMP) and cleans) and that can provide a permanent sealing layer 104 for support.

Figure 4:
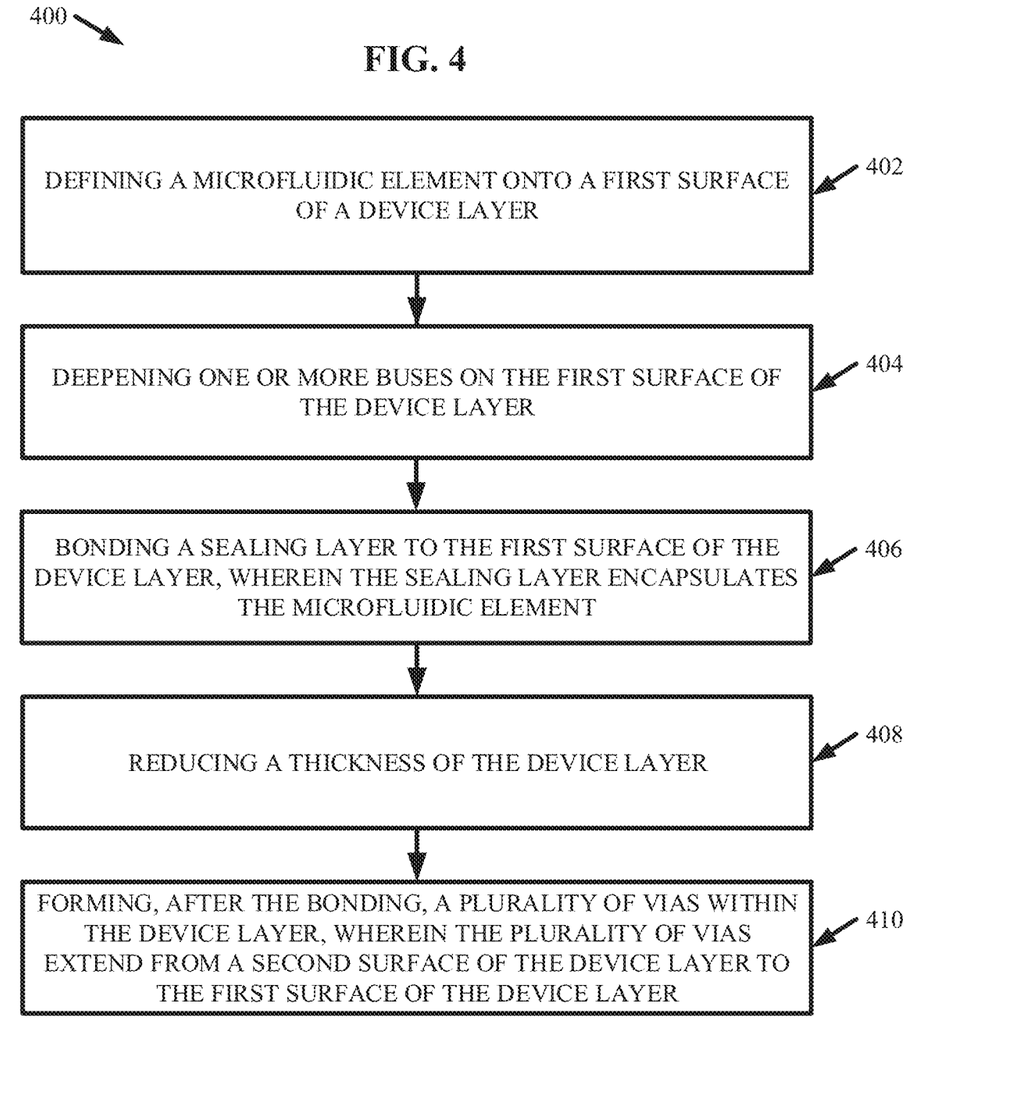
FIG. 4 illustrates a flow diagram of an example, non-limiting method that can facilitate manufacturing a microfluidic chip that can comprise a high density of vias in accordance with one or more embodiments described herein.

FIG. 4 illustrates a flow diagram of an example, non-limiting method 400 that can facilitate manufacturing the microfluidic chip 100 in accordance with one or more embodiments described herein. Repetitive description of like elements employed in other embodiments described herein is omitted for sake of brevity.

At 402, the method 400 can comprise defining one or more microfluidic elements 108 and/or one or more buses 106 onto the surface of a device layer 110. For example, the one or more microfluidic elements 108 and/or the one or more buses 106 can be defined on a first lithography layer and patterned unto the surface of the device layer 110. Depending on the minimum feature size of the microfluidic elements 108 and/or buses 106, a number of lithography options can be employed during the method 400, including but not limited to: various wavelength optical lithography (mid-ultraviolet ("UV"), deep-UV, 193 nm (e.g. argon fluoride laser)), immersion lithography, e-beam lithography, imprint lithography, interference lithography, x-ray lithography, a combination thereof, and/or the like.

Figure 5:
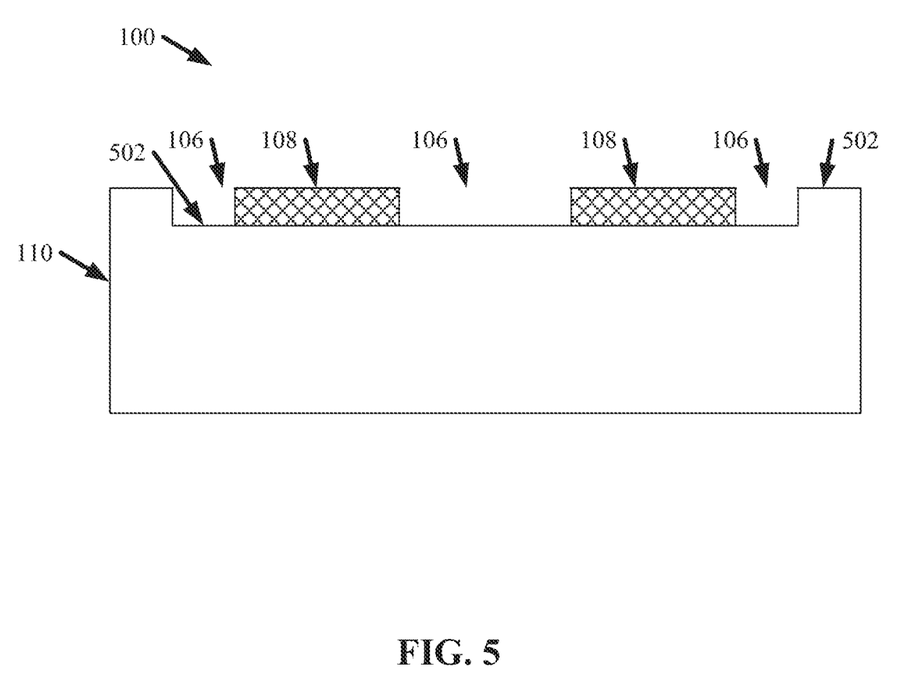
FIG. 5 illustrates a diagram of an example, non-limiting microfluidic chip at a first stage of manufacturing in accordance with one or more embodiments described herein.

FIG. 5 illustrates a diagram of an example, non-limiting microfluidic chip 100 being manufactured in accordance with method 400. Repetitive description of like elements employed in other embodiments described herein is omitted for sake of brevity. FIG. 5 can show a cross-section of the microfluidic chip 100 after completion of the defining at 402. As shown in FIG. 5, the defining at 402 can comprising defining one or more microfluidic elements 108 and/or one or more buses 106 onto a first surface 502 of the device layer 110.

Referring again to FIG. 4, at 404 the method 400 can optionally comprise deepening the one or more buses 106. Respective buses 106 can be deepened in their entirety at 404, or only a portion of a respective bus 106 can be deepened. The deepening at 404 can be facilitated by a second lithography layer, which can be used in conjunction with an etch process (e.g., RIE, tetramethylammonium hydroxide ("TMAH") etching, potassium hydroxide ("KOH") etching, a combination thereof, and/or the like). The deepening at 404 can be omitted for sufficiently small microfluidic chips 100 or those whose microfluidic elements 108 are very fluidically restrictive. Essentially, parallel device arrays or other microfluidic elements 108 can drop most of the fluidic resistance to avoid one or more discrepancies in fluidic rate conditions in the one or more buses 106 (e.g., the plurality of buses 106 can comparably have very high fluidic conductance).

Figure 6:
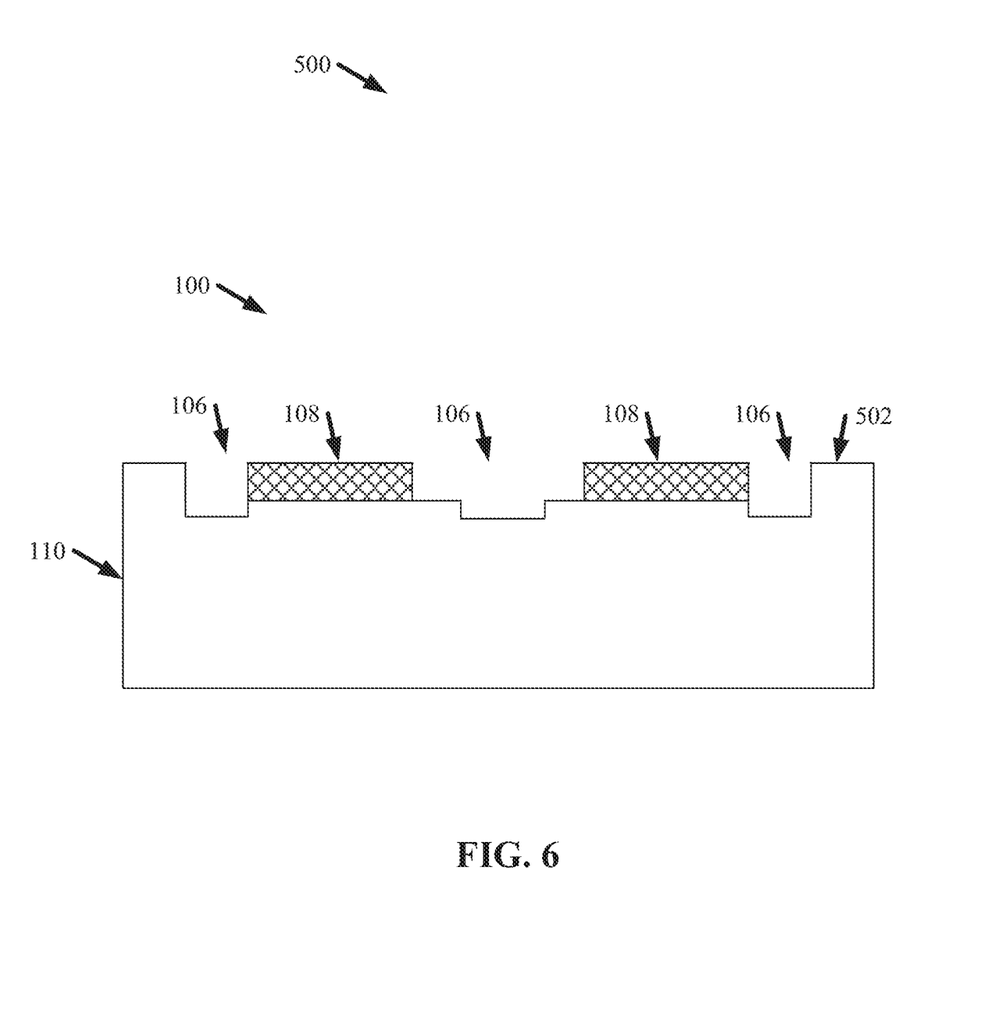
FIG. 6 illustrates a diagram of an example, non-limiting microfluidic chip at a second stage of manufacturing in accordance with one or more embodiments described herein.

FIG. 6 illustrates a diagram of an example, non-limiting microfluidic chip 100 being manufactured in accordance with method 400. Repetitive description of like elements employed in other embodiments described herein is omitted for sake of brevity. FIG. 6 can show a cross-section of the microfluidic chip 100 after completion of the deepening at 404.

Referring again to FIG. 4, at 406 the method 400 can comprise bonding a sealing layer 104 to the surface of the device layer 110. For example, the sealing layer 104 can be permanently bonded to the device layer 110. The sealing layer 104 can be anodically bonded glass (e.g. Borofloat 33), a thermally bonded silicon wafer, and/or other substrates. Glass and other transparent substrate options offer the advantage of transparency for applications that require some kind of in situ analysis, such as fluorescence microscopy. Sealing the device layer 110 can serve at least two purposes: 1) it can prevent downstream damage, wetting, and process contamination from impacting the microfluidic chip 100 features, and 2) it can act as a support for a thinned device layer 110 when polished subsequently in the method 400.

Figure 7:
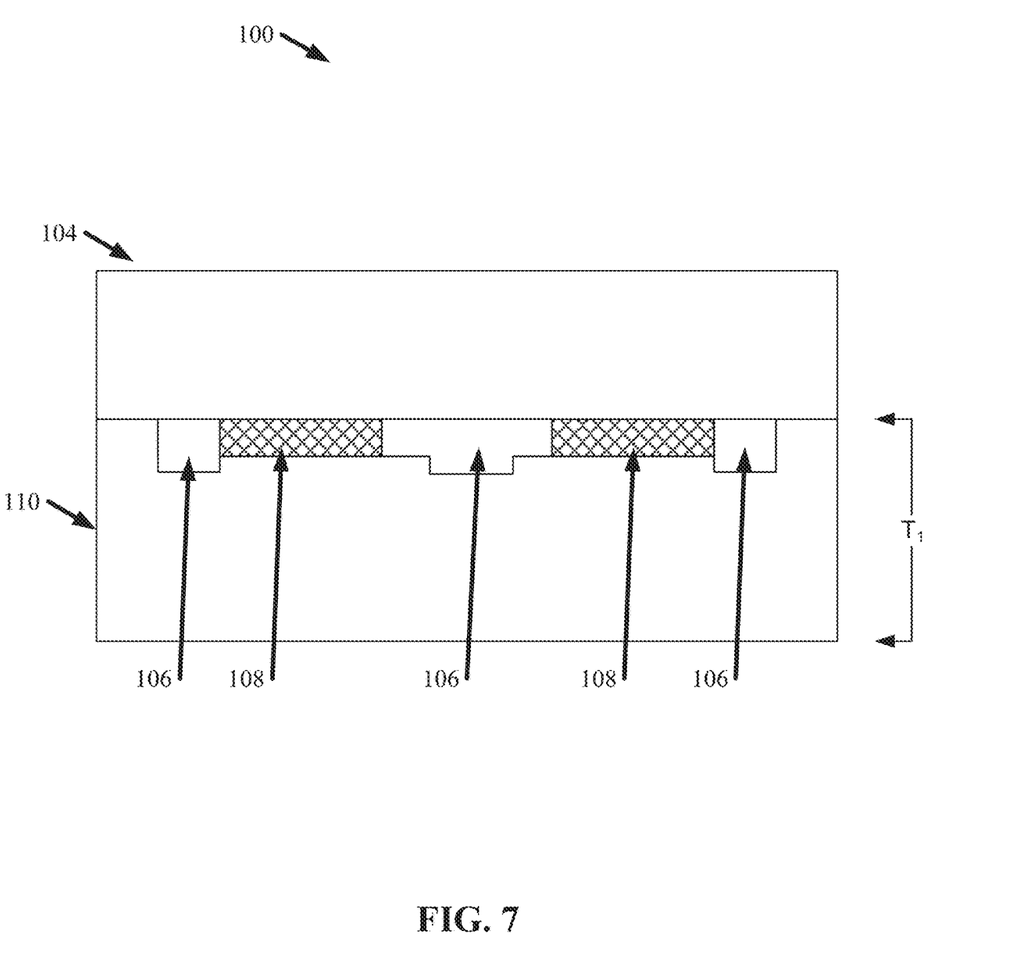
FIG. 7 illustrates a diagram of an example, non-limiting microfluidic chip at a third stage of manufacturing in accordance with one or more embodiments described herein.

FIG. 7 illustrates a diagram of an example, non-limiting microfluidic chip 100 being manufactured in accordance with method 400. Repetitive description of like elements employed in other embodiments described herein is omitted for sake of brevity. FIG. 7 can show a cross-section of the microfluidic chip 100 after completion of the bonding at 406.

Referring again to FIG. 4, at 408 the method 400 can comprise reducing the thickness of the device layer 110 to a final thickness. The thinning at 408 can be facilitated using a chemical-mechanical planarization ("CMP") or a wet process (e.g., TMAH and/or KOH etching). The device layer 110 can be thinned to a thickness of 7-500 μm post subsequent to the bonding at 406. By thinning the device layer 110, scaled fluidic vias 102 with diameters ranging from 5 μm to 100 μm can be possible to fabricate in up to 300 mm wafers 200 with a starting nominal thickness of 775 μm, which can mate with the microfluidic elements 108 and/or buses 106 to input and extract a sample from various access points on the microfluidic chip 100.

Figure 8:
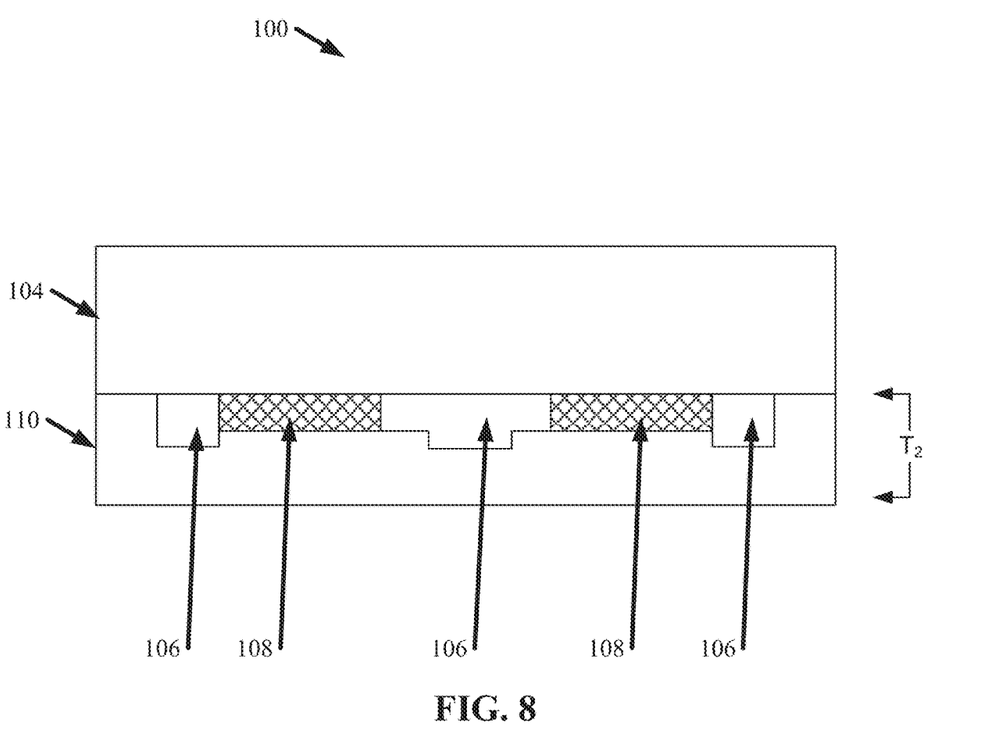
FIG. 8 illustrates a diagram of an example, non-limiting microfluidic chip at a fourth stage of manufacturing in accordance with one or more embodiments described herein.

FIG. 8 illustrates a diagram of an example, non-limiting microfluidic chip 100 being manufactured in accordance with method 400. Repetitive description of like elements employed in other embodiments described herein is omitted for sake of brevity. FIG. 8 can show a cross-section of the microfluidic chip 100 after completion of the reducing at 408. As shown in FIGS. 7 and 8, "$T_1$" can represent the thickness of the device layer 110 prior to the thinning at 408, and "$T_2$" can represent the thickness of the device layer 110 subsequent to the thinning at 408; wherein $T_1$ can be greater than $T_2$.

Referring again to FIG. 4, at 410 the method 400 can comprise forming one or more vias 102 in the device layer 110. The one or more vias 102 can extend completely through the device layer 110. Front-to-back alignment of the one or more vias 102 can be performed using an optical and/or infrared ("IR") camera to ensure alignment accuracy of a third lithography layer needed to align the vias 102 patterned on the back side of the device layer 110 (e.g., the side opposite to a side comprising the one or more microfluidic elements 108) with the front side microfluidic elements 108, which reside in the device layer 110 (e.g., comprised of silicon) at the interface of the sealing layer 104 and device layer 110. The third lithography layer can be used to pattern the one or more vias 102 in a hard mask, such as silicon oxide and/or silicon nitride, followed by removal of the resist and cleaning of the device layer 110, after which the one or more vias 102 can be defined by a RIE process. Alternatively, the third lithography layer can be used as the etch mask itself and can be removed with an oxygen plasma after the one or more vias 102 have been opened. The first approach of defining the one or more vias 102 in a hard mask has the advantage of being able to more thoroughly clean the bonded layer pair (e.g., the device layer 110 bonded to the sealing layer 104) before the final via 102 opening RIE process. Wherein multiple microfluidic chips 100 are formed on a wafer 200, the microfluidic chips 100 can then be diced employing a standard dicing process and bonding film of sufficient tack to prevent fluid from entering the vias 102.

Figure 9:
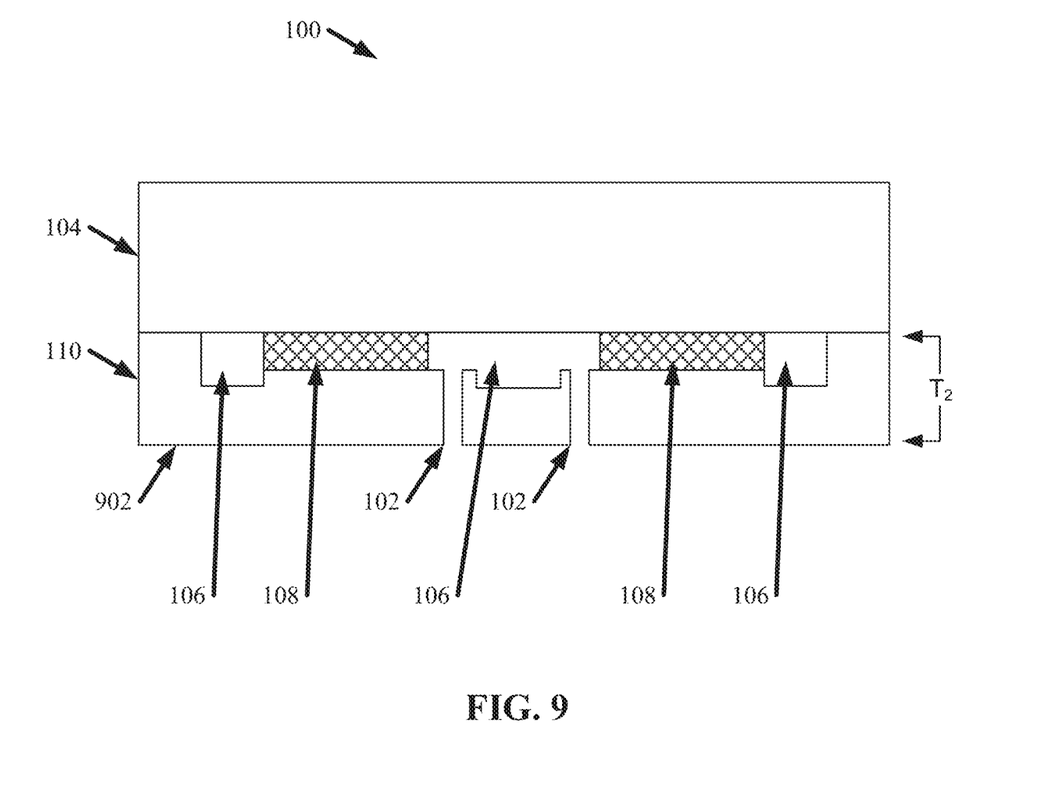
FIG. 9 illustrates a diagram of an example, non-limiting microfluidic chip at a fifth stage of manufacturing in accordance with one or more embodiments described herein.

FIG. 9 illustrates a diagram of an example, non-limiting microfluidic chip 100 being manufactured in accordance with method 400. Repetitive description of like elements employed in other embodiments described herein is omitted for sake of brevity. FIG. 9 can show a cross-section of the microfluidic chip 100 after completion of the forming of the vias 102 at 410. As shown in FIG. 9, once formed the one or more vias 102 can extend from a second surface 902 of the device layer 110 to the first surface 502 of the device layer 110.

Figure 10:
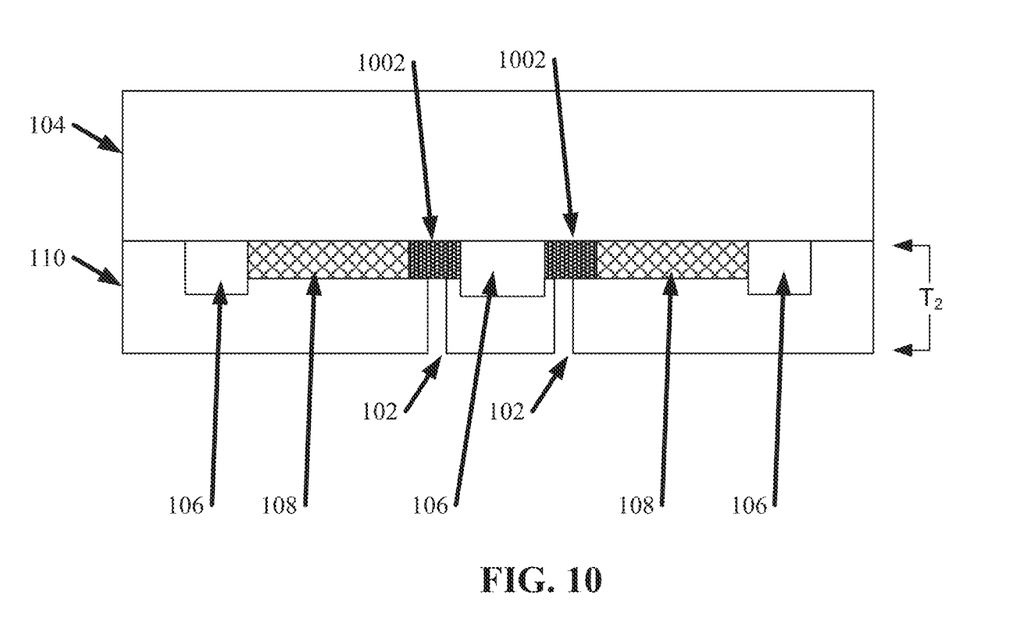
FIG. 10 illustrates a diagram of an example, non-limiting microfluidic chip that can comprise a high density of vias in accordance with one or more embodiments described herein.

In one or more embodiments, the microfluidic chip 100 can further comprise one or more sacrificial plugs 1002. The method 400 can comprise inserting the sacrificial plugs 1002 into the device layer 110 after defining the one or more buses 106 (e.g., at 402 and/or 404) and prior to bonding the device layer 110 to the sealing layer 104 (e.g., at 406). The sacrificial plugs 1002 can be patterned using a resist material. The one or more sacrificial plugs 1002 can perform the function of ensuring uniformity of RIE breakthrough to the one or more microfluidic elements 108, ensuring that the one or more microfluidic elements 108 are not themselves etched by the forming of the one or more vias 102. This may be particularly useful in cases where the one or more vias 102 have different dimensions and thus etch at different rates. The sacrificial plugs 1002 can be extracted using a downstream oxygen plasma (e.g., before or after the microfluidic chip 100 is diced).

FIG. 10 illustrates a diagram of an example, non-limiting microfluidic chip 100 being manufactured in accordance with method 400. Repetitive description of like elements employed in other embodiments described herein is omitted for sake of brevity. FIG. 7 can show a cross-section of the microfluidic chip 100 after completion of the forming of the vias 102 at 410, wherein one or more sacrificial plugs 1002 were inserted into the device layer 110.

Thus, method 400 can facilitate manufacturing one or more microfluidic chips 100 described herein by forming the one or more vias 102 as a last step. Unlike conventional TSV technology, the fluidic vias 102 of microfluid chip 100 can be open structures, which makes chips that implement them vulnerable to destruction by capillary action of wets processing common in semiconductor manufacturing. However, method 400 avoids destruction of the microfluidic chip 100 by using a final RIE process (dry) to open the vias 102. Additionally, by thinning the device layer 110 (e.g., silicon) prior to forming the one or more vias 102, the method 400 can avoid conventional requirements of ultra-deep silicon etching that would otherwise be required to create the fluidic vias 102 and is problematic to implement in a practical process flow. Moreover, while method 400 is described herein with regard to a microfluidic chip 100 comprising a high density of vias 102, method 400 can also applicable to the manufacturing of microfluidic chips 100 only a few vias 102.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method, comprising
defining a microfluidic element embedded within a first surface of a device layer, wherein the device layer comprises a layer of a microfluidic chip;
bonding a sealing layer to the first surface of the device layer,
wherein the sealing layer is directly connected to and adjacent a first surface of the microfluidic element, wherein the device layer is directly connected to and adjacent a second surface of the microfluidic ele- ment, wherein the second surface of the microfluidic element is opposite the first surface of the microfluidic element, wherein the sealing layer is directed connected to and adjacent a first bus of a plurality of buses and wherein the device layer is directly connected to and adjacent the first bus of the plurality of buses, wherein the first bus is a channel that guides fluid through the microfluidic chip and wherein the first bus of the plurality of buses is immediately adjacent and connected to the microfluidic element; and forming, after the bonding, vias within the device layer, wherein the vias extend entirely through the device layer from a second surface of the device layer through to the first surface of the device layer, wherein the second surface is located on a side of the device layer opposite the first surface, wherein a second bus of the plurality of buses is directly connected to the vias and directly connected to and adjacent the first surface of the device layer, and wherein the second bus is open to an environment outside of the microfluidic chip and fails to be encapsulated by the sealing layer and the device layer.

2. The method of claim 1, wherein the forming the vias comprises etching through the device layer.

3. The method of claim 1, further comprising thinning the device layer after the bonding and before the forming the vias.

4. The method of claim 3, wherein the thinning comprises reducing a thickness of the device layer to a value greater than or equal to about 7 micrometers and less than or equal to about 500 micrometers.

5. The method of claim 1, further comprising providing a sacrificial plug on the device layer and coplanar with the microfluidic element, wherein the sacrificial plug protects the microfluidic element from the forming the vias.

6. The method of claim 1, wherein the forming the vias comprises forming greater than or equal to about 100 vias and less than or equal about 100,000 vias per square centimeter of a second surface.

\* \* \* \* \*